United States Patent
Kim

(10) Patent No.: US 8,791,518 B2
(45) Date of Patent: Jul. 29, 2014

(54) METHOD FOR MANUFACTURING SEMICONDUCTOR DEVICE

(75) Inventor: Sang Heon Kim, Seoul (KR)

(73) Assignee: Hynix Semiconductor Inc., Icheon (KR)

(*) Notice: Subject to any disclaimer, the term of this patent is extended or adjusted under 35 U.S.C. 154(b) by 214 days.

(21) Appl. No.: 13/346,965

(22) Filed: Jan. 10, 2012

(65) Prior Publication Data

US 2012/0306057 A1    Dec. 6, 2012

(30) Foreign Application Priority Data

May 30, 2011    (KR) .................... 10-2011-0051657

(51) Int. Cl.
*H01L 27/108* (2006.01)

(52) U.S. Cl.
USPC .... 257/306; 257/296; 257/535; 257/E27.088; 257/E27.094

(58) Field of Classification Search
USPC ................. 257/296, 306, 307, 309, 532, 535, 257/E27.034, E27.084, E27.088, E27.089, 257/E27.094, E27.086
See application file for complete search history.

(56) References Cited

U.S. PATENT DOCUMENTS 6,576,946 B1 * 6/2003 Kanai et al. .................. 257/306
7,554,788 B2 * 6/2009 Baik ........................... 361/321.6

* cited by examiner

*Primary Examiner* — Eduardo A Rodela

(57) ABSTRACT

A method for manufacturing a semiconductor device is disclosed. In the method for manufacturing the semiconductor device, a capacitor structure is modified to ensure capacitance of the capacitor, and the height of the capacitor is reduced to prevent defects such as a leaning capacitor or a poor bridge from being generated, such that the fabrication process of semiconductor devices is simplified and therefore the semiconductor devices can be stably manufactured.

15 Claims, 13 Drawing Sheets

Cell Array

METHOD FOR MANUFACTURING SEMICONDUCTOR DEVICE

CROSS-REFERENCE TO RELATED APPLICATION

The priority of Korean patent application No. 10-2011-0051657 filed on 30 May 2011, the disclosure of which is hereby incorporated in its entirety by reference, is claimed.

BACKGROUND OF THE INVENTION

Embodiments of the present invention relate to a method for manufacturing a semiconductor device in which a capacitor structure is modified to ensure capacitance of the capacitor, and the height of the capacitor is reduced to prevent the leaning capacitor or a defective or poor bridge from being generated, such that the fabrication process of semiconductor devices is simplified and therefore the semiconductor devices can be stably manufactured.

In case of a semiconductor device such as a Dynamic Random Access Memory (DRAM), it is necessary to reduce the area occupied by the semiconductor device in proportion to the increasing degree of integration while maintaining or increasing the level of electrostatic capacitance. There are a variety of methods to guarantee sufficient cell electrostatic capacitance within a limited area; for example, using a high dielectric material as a dielectric film, reducing a thickness of the dielectric film, increasing an effective region of a lower electrode, etc. However, using the high dielectric material requires time and material investment, for example, the introduction of new equipment or installations, the necessity of verifying the reliability and productivity of a dielectric film, low-temperature processing of a subsequent process, etc. Accordingly, increasing the effective region has an advantage in that a conventional dielectric film can be continuously used and the implementation of a fabrication process becomes relatively easier. Increasing the effective region has been widely used in the actual fabrication process due to the above-mentioned advantages.

There are a variety of known methods to increase an effective region of the lower electrode, for example, a method for configuring a lower electrode in the form of a three-dimensional (3D) structure (such as a cylinder or a fin), a method for growing a Hemi Spherical Grain (HSG) on a lower electrode, a method for increasing the height of a lower electrode, etc. Specifically, the method for growing the HSG may cause unexpected problems in guaranteeing a Critical Dimension (CD) of at least a predetermined level between lower electrodes, and may cause a bridge between lower electrodes due to infrequent HSG desquamation, so that it is difficult for the aforementioned HSG growing method to be applied to a semiconductor device based on a design rule of 0.14 μm or less. Therefore, in general, in order to increase cell electrostatic capacitance, a variety of methods for configuring a lower electrode in the form of a 3D structure and increasing the height of the lower electrode have been widely used. A representative example of such methods is a method for forming a cylindrical lower electrode or a stack-shaped lower electrode.

Specifically, conventional methods for forming the cylindrical lower electrode necessarily include removing a sacrificial insulation film from a peripheral part of the lower electrode, and depositing a dielectric film over the lower electrode. In this case, the dielectric material contained in the dielectric film is not deposited only over the lower electrode, but is deposited between neighboring lower electrodes, such that all the cells can share a dielectric material and an upper electrode formed over the dielectric material. Provided that the cells share and use such a dielectric material, capacitance (storage capacitance) among all the lower electrodes may be interfered or distorted.

As described above, in order to maximize cell capacitance for improving refresh characteristics of the conventional cylindrical lower electrode, the height of each lower electrode becomes increased and the spacing between the lower electrode contact plugs is smaller. As a result, there arises a bridge between lower electrodes, and it is difficult to guarantee a contact region between the lower electrode contact plug and the lower electrode.

BRIEF SUMMARY OF THE INVENTION

Various embodiments of the present invention are directed to providing a method for manufacturing a semiconductor device that substantially obviates one or more problems due to limitations and disadvantages of the related art.

An embodiment of the present invention relates to a method for manufacturing a semiconductor device in which a capacitor structure is modified to ensure capacitance of the capacitor, and the height of the capacitor is reduced to prevent defects such as a leaning capacitor or a poor bridge from being generated, such that the fabrication process of semiconductor devices is simplified and therefore the semiconductor devices can be stably manufactured.

In accordance with an aspect of the present invention, a semiconductor device includes a first storage node contact plug formed in a hole type over a semiconductor substrate; a second storage node contact plug formed in a pad type over the first storage node contact plug; a third storage node contact plug formed in a bar type over the second storage node contact plug; and a lower electrode formed in a bar type over the third storage node contact plug.

The second storage node contact plug may be formed not to overlap with a contiguous second storage node contact plug.

The third storage node contact plug may be smaller in size than the second storage node contact plug.

The third storage node contact plug may be formed over the second storage node contact plug, in which one third storage node contact plug is arranged at the same position on each second storage node contact plug along a direction parallel to a bit line.

The third storage node contact plug may be formed over the second storage node contact plug, in which one third storage node contact plug is arranged at a different position on each second storage node contact plug along a direction perpendicular to a bit line.

The length of a long-axis direction of the lower electrode may be longer than the length of a long-axis direction of the third storage node contact plug.

The second storage node contact plug may be formed in a square or rectangle shape.

The second storage node contact plug may be larger in width than the first storage node contact plug.

The third storage node contact plug may be formed in an island type.

In accordance with another aspect of the present invention, a method for manufacturing a semiconductor device includes forming a first storage node contact plug of a hole type over a semiconductor substrate; forming a second storage node contact plug of a pad type over the first storage node contact plug; forming a third storage node contact plug of a bar type over the second storage node contact plug; and forming a lower electrode formed of a bar type over the third storage node contact plug.

The second storage node contact plug may be formed not to overlap with a contiguous second storage node contact plug.

The third storage node contact plug may be smaller in size than the second storage node contact plug.

The third storage node contact plug may be formed over the second storage node contact plug, in which one third storage node contact plug is arranged at the same position on each second storage node contact plug along a direction parallel to a bit line.

The third storage node contact plug may be formed over the second storage node contact plug, in which one third storage node contact plug is arranged at a different position on each second storage node contact plug along a direction perpendicular to a bit line.

The length of a long-axis direction of the lower electrode may be longer than the length of a long-axis direction of the third storage node contact plug.

The second storage node contact plug may be formed in a square or rectangle shape.

The second storage node contact plug may be larger in width than the first storage node contact plug.

The third storage node contact plug may be formed in an island type.

In accordance with another aspect of the present invention, a unit cell includes a first storage node contact plug formed in a hole type over a semiconductor substrate; a second storage node contact plug formed in a pad type over the first storage node contact plug; a third storage node contact plug formed in a bar type over the second storage node contact plug; and a lower electrode formed in a bar type over the third storage node contact plug.

In accordance with another aspect of the present invention, a cell array includes a first storage node contact plug formed in a hole type over a semiconductor substrate; a second storage node contact plug formed in a pad type over the first storage node contact plug; a third storage node contact plug formed in a bar type over the second storage node contact plug; and a lower electrode formed in a bar type over the third storage node contact plug.

In accordance with another aspect of the present invention, a semiconductor device includes a plurality of cell arrays including a plurality of unit cells; a row decoder coupled to each cell array, a column decoder coupled to each cell array; and a sense amplifier for sensing data stored in a unit cell selected by the row decoder and the column decoder. The unit cell includes a first storage node contact plug formed in a hole type over a semiconductor substrate; a second storage node contact plug formed in a pad type over the first storage node contact plug; a third storage node contact plug formed in a bar type over the second storage node contact plug; and a lower electrode formed in a bar type over the third storage node contact plug.

In accordance with another aspect of the present invention, a semiconductor module includes a plurality of semiconductor chips each including a plurality of unit cells; a command link coupled to the semiconductor chips so as to transmit/receive a command signal to and from the semiconductor chips; and a data link coupled to the semiconductor chips so as to transmit/receive data to and from the semiconductor chips. The unit cell includes a first storage node contact plug formed in a hole type over a semiconductor substrate; a second storage node contact plug formed in a pad type over the first storage node contact plug; a third storage node contact plug formed in a bar type over the second storage node contact plug; and a lower electrode formed in a bar type over the third storage node contact plug.

In accordance with another aspect of the present invention, a semiconductor system includes a plurality of semiconductor modules each including a plurality of unit cells; a command link coupled to the semiconductor modules so as to transmit/receive a command signal to and from the semiconductor modules; a data link coupled to the semiconductor modules so as to transmit/receive data to and from the semiconductor modules; and a controller for controlling an interactive interface with an external system. The unit cell includes a first storage node contact plug formed in a hole type over a semiconductor substrate; a second storage node contact plug formed in a pad type over the first storage node contact plug; a third storage node contact plug formed in a bar type over the second storage node contact plug; and a lower electrode formed in a bar type over the third storage node contact plug.

In accordance with another aspect of the present invention, an electronic unit includes a plurality of semiconductor systems each including a unit cell, and a processor coupled to the semiconductor systems. The unit cell includes a first storage node contact plug formed in a hole type over a semiconductor substrate; a second storage node contact plug formed in a pad type over the first storage node contact plug; a third storage node contact plug formed in a bar type over the second storage node contact plug; and a lower electrode formed in a bar type over the third storage node contact plug.

In accordance with another aspect of the present invention, an electronic system includes an electronic unit including a plurality of unit cells, and one or more interfaces coupled to the electronic unit. The unit cell includes a first storage node contact plug formed in a hole type over a semiconductor substrate; a second storage node contact plug formed in a pad type over the first storage node contact plug; a third storage node contact plug formed in a bar type over the second storage node contact plug; and a lower electrode formed in a bar type over the third storage node contact plug.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts. The figures illustrate embodiments of the present invention, but may not be exact representations of the dimensions and shapes that are realized in some embodiments. For example, certain features may be exaggerated or otherwise altered in the figures in order to better illustrate certain inventive concepts.

FIGS. 1A to 1I are layout diagrams illustrating a semiconductor device according to embodiments of the present invention.

Figure 1A:
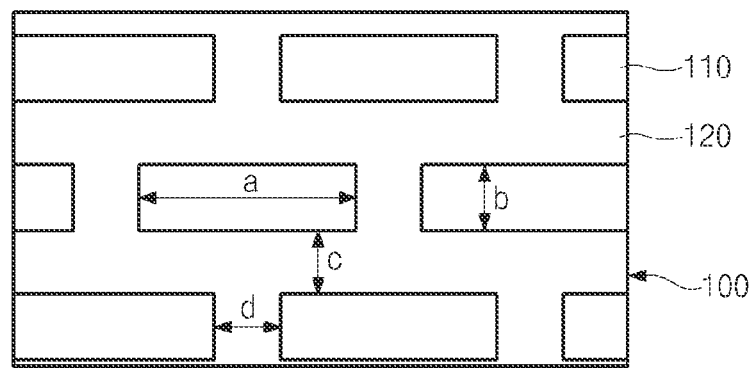
FIGS. 1A to 1I are layout diagrams illustrating a semiconductor device according to embodiments of the present invention.

Referring to FIG. 1A, a device isolation film 120 defining an active region 110 is disposed over a semiconductor substrate 100. The active region 110 may be configured in the form of an island, and is formed along a long-axis direction perpendicular to a word line to be formed in a subsequent process. In an embodiment, the length (a) of the long-axis direction of the active region 110 may be about 60 nm~300 nm, the width (b) of the short-axis direction may be about 20 nm~100 nm, and the spacing (c) and (d) between the active regions 110 may be about 20 nm~100 nm.

Figure 1B:
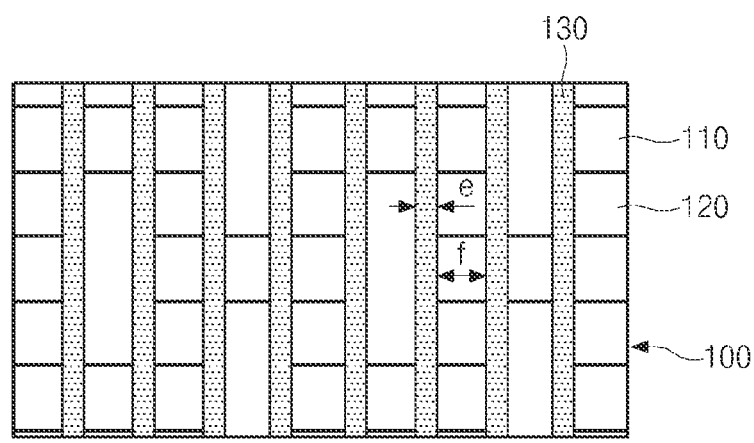

Referring to FIG. 1B, word line 130 is perpendicular to the active region 110. Preferably, the width of the word line 130 may be about 20 nm~100 nm, and the spacing (f) between neighboring word lines 130 may be about 20 nm~100 nm. The width (e) of the word line may be about the same as the spacing (f) between the word lines.

Figure 1C:
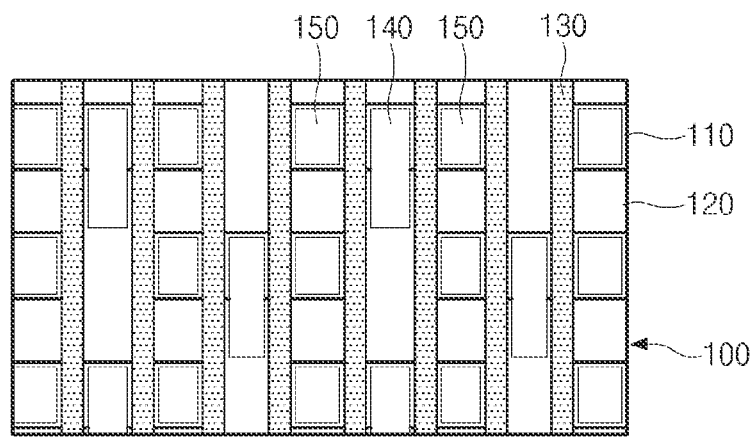

Referring to FIG. 1C, landing plugs 140 and 150 are disposed over the active region 110. In an embodiment, the active region 110 is trisected, such that a landing plug 140 for a bit line contact may be formed at the center part of the active region 110 and a landing plug 150 for a storage node is disposed at both edges of the active region 110. In this case, the landing plugs 140 and 150 may be formed over the same layer, and may be disposed in a contact hole.

Figure 1D:
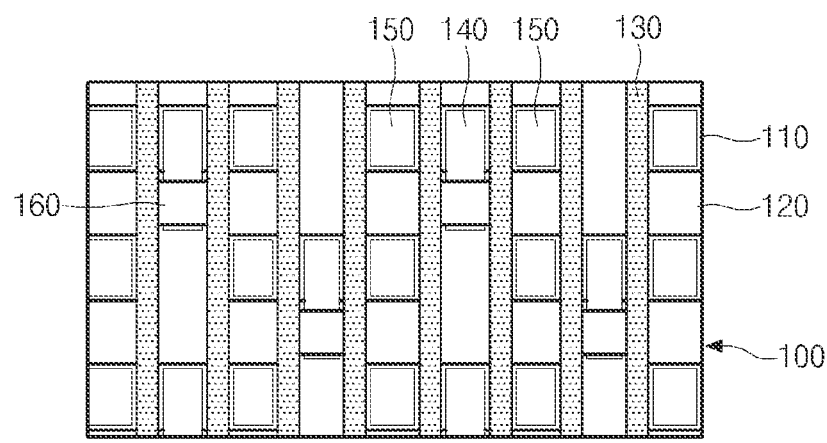

Referring to FIG. 1D, a bit line contact plug 160 is disposed over the landing plug 140 for the bit line contact. In this case, the bit line contact plug 160 may have a size of 20 nm~100 nm, and may be disposed in a contact hole.

Figure 1E:
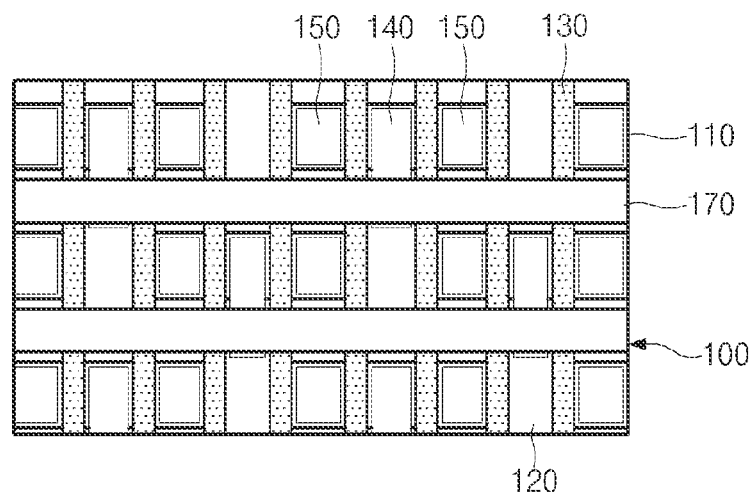

Referring to FIG. 1E, a bit line 170 coupled to the bit line contact plug 160 is formed. In an embodiment, the bit line 170 may be coupled to the bit line contact plug 160, may be a line type with a long axis disposed along the direction perpendicular to the word line 130, and may be configured to not overlap with the storage node landing plug 150.

Figure 1F:
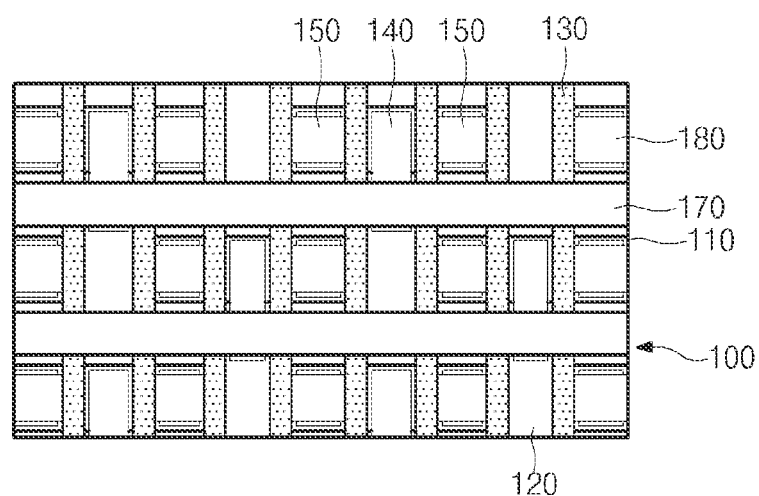

Referring to FIG. 1F, a first storage node contact plug 180 is formed over the storage node landing plug 150. The first storage node contact plug 180 may have the size of 20 nm~100 nm, be configured to not overlap with the bit line 170, and may be disposed in a contact hole.

Figure 1G:
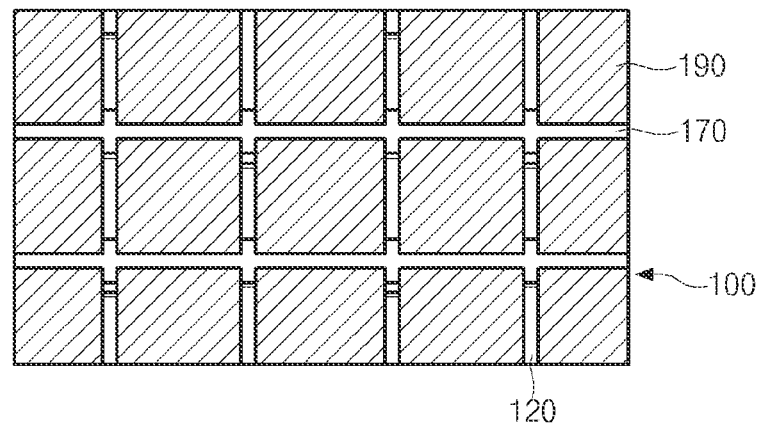

Referring to FIG. 1G, a second storage node contact plug 190 is formed over the first storage node contact plug 180. The second storage node contact plug 180 may be a pad type, and may also be a square or rectangle type in other embodiments. In an embodiment, neighboring second storage node contact plugs 190 are configured to be spaced apart from one another.

Figure 1H:
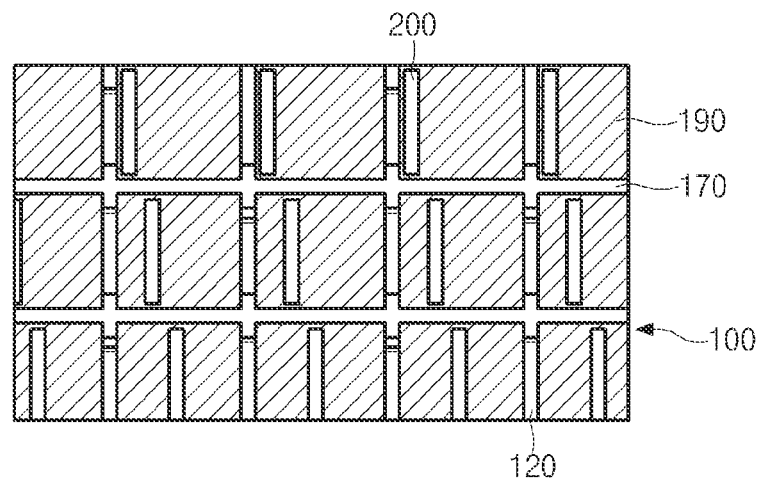

Referring to FIG. 1H, a third storage node contact plug 200 is formed over the second storage node contact plug 190. The third storage node contact plug 200 may be a bar type. In another embodiment, the third storage node contact plug 200 may be an island type. Third storage node contact plugs 200 may be configured to correspond to a single lower electrode that is formed in a subsequent process. For example, if the second storage node contact plug 190 is divided into five equal parts, a third storage node contact plug 200 is disposed over one of the parts. Although FIG. 1H shows an embodiment configured for five equal parts, the invention is not limited thereby. Other embodiments may include a different number of parts, such as three, four, six, or seven.

Figure 1I:
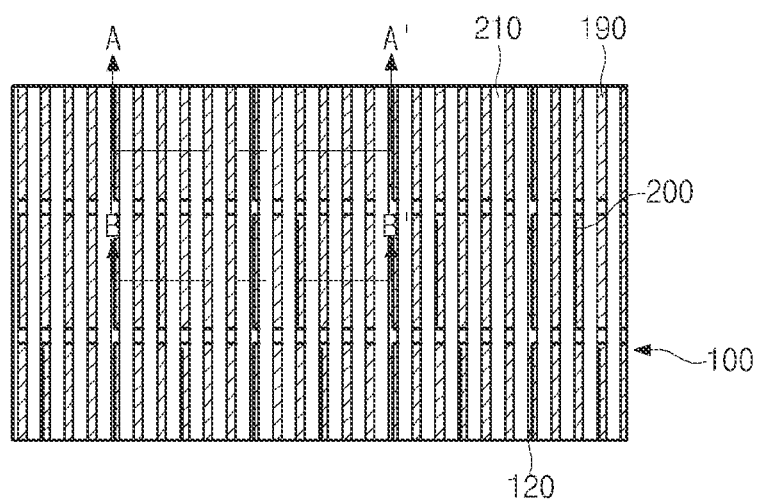

Referring to FIG. 1I, a lower electrode 210 is formed over a third storage node contact plug 200. The lower electrode 210 may be a bar type, and each lower electrode 210 may be coupled to a single third storage node contact plug 200. FIG. 1I is an enlarged view of FIG. 2.

Figure 2:
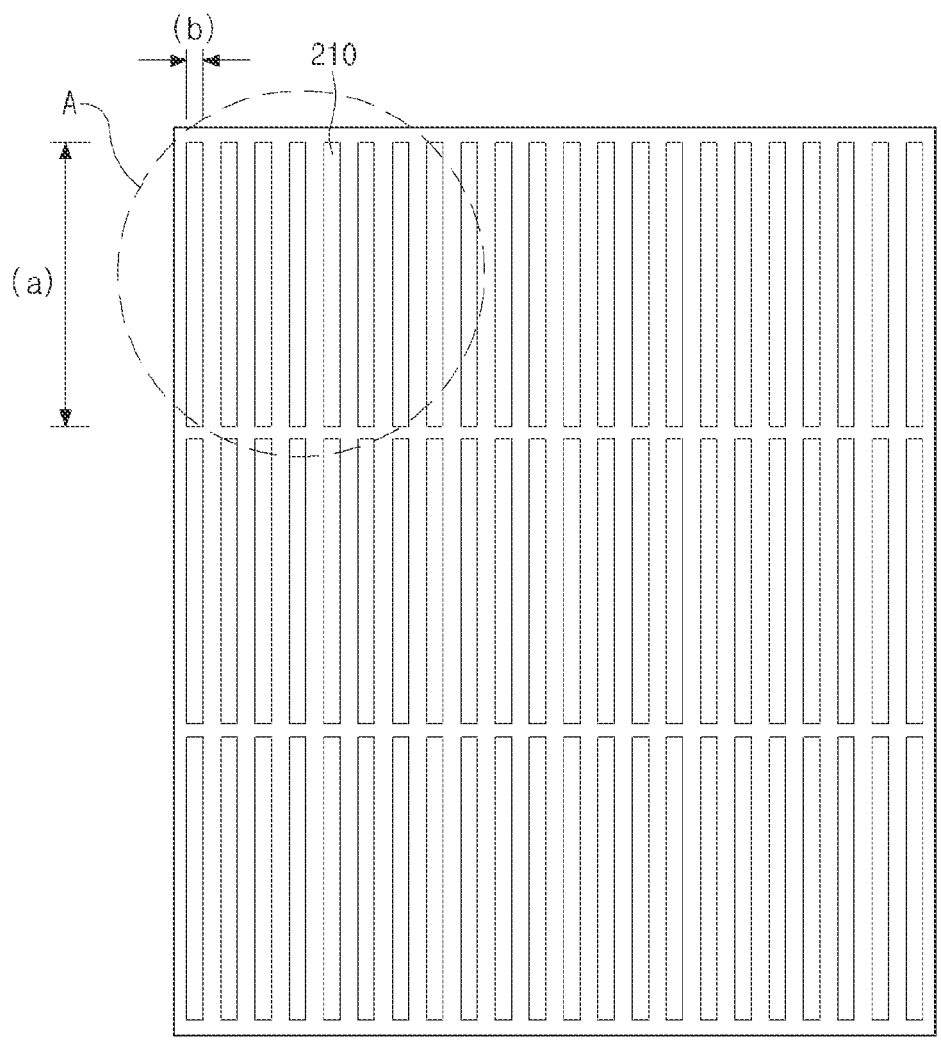
FIG. 2 is a cross-sectional view illustrating a semiconductor device according to embodiments of the present invention.

FIG. 2 is a cross-sectional view illustrating a semiconductor device according to an embodiment of the present invention. As can be seen from FIG. 2, a lower electrode 210 may be a bar type, and a plurality of lower electrodes 210 may be arranged along the long-axis direction (a) and the short-axis direction (b). Referring to the long-axis direction (a) of the lower electrode 210, each lower electrode 210 is disposed over five second storage node contact plugs 190, but each lower electrode 210 is only coupled to one of the five second storage node contact plugs 190 through a single third storage node contact plug 200. Every such set of five second storage note contact plugs 190 over which a single lower electrode 210 is disposed can be referred to as a group. Although FIG. 2 shows a plurality of lower electrodes 210 with the long axis of the electrodes disposed in a direction parallel to a word line 130, in another embodiment, the plurality of lower electrodes 210 may be disposed with the long axis perpendicular to the word line, which is a horizontal direction with respect to FIG. 2.

Figure 3:
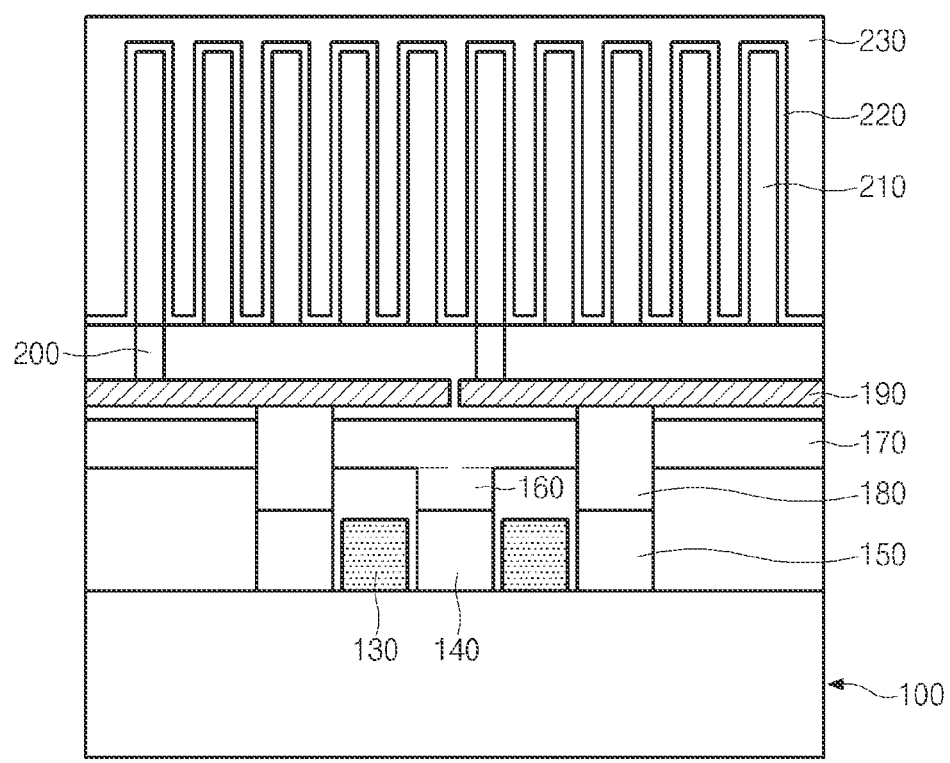
FIGS. 3 and 4 are cross-sectional views illustrating a method for manufacturing a semiconductor device according to embodiments of the present invention.
Figure 4:
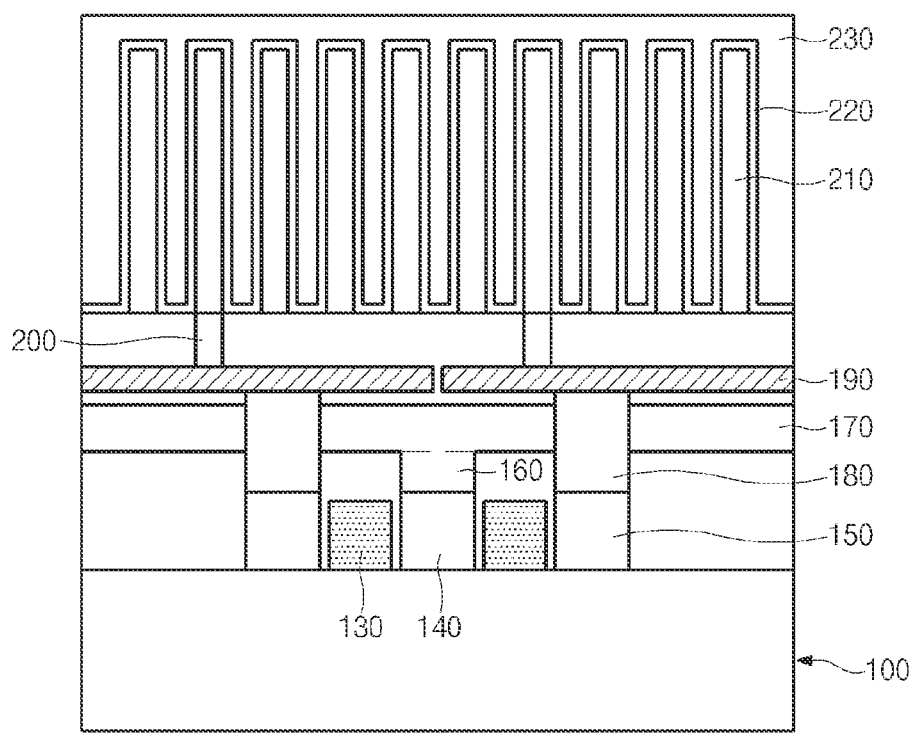

FIGS. 3 and 4 are cross-sectional views illustrating a method for manufacturing a semiconductor device according to embodiments of the present invention. FIG. 3 is a cross-sectional view illustrating a semiconductor device taken along the line A-A' of FIG. 1I, and FIG. 4 is a cross-sectional view illustrating a semiconductor device taken along the line B-B' of FIG. 1I.

Referring to FIG. 3, a word line 130 is formed over the semiconductor substrate 100.

The bit line contact landing plug 140 and the storage node landing plug 150 are formed over portions of the active region (110 of FIG. 1C) exposed between the word lines 130. The active region is trisected, such that the bit line contact landing plug 140 is formed at the center part of the active region and storage node landing plugs 150 are formed at both edges of the active region. The landing plugs 140 and 150 may be formed over the same layer, and may be disposed in a contact hole.

In addition, the bit line contact plug 160 and the bit line 170 are sequentially formed over the bit line contact landing plug 140. The first storage node contact plug 180, the second storage node contact plug 190 and the third storage node contact plug 200 are sequentially formed over the storage node landing plug 150.

The bit line contact plug 160 may be formed to have the size of about 20 nm~100 nm, and may be an island type. The bit line 170 may be coupled to the bit line contact plug 160, may be formed in a line type perpendicular to the word line 130, may not overlap with the storage node landing plug 150. In addition, the first storage node contact plug 180 may be formed to have the size of about 20 nm~100 nm. The first storage node contact plug 180 may not overlap with the bit line 170, and may be disposed in a contact hole.

The second storage node contact plug 190 may be formed as a pad type, and may not overlap with the second storage node contact plug 190. The third storage node contact plug 200 may be formed as a bar type. The third storage node contact plugs 200 may be formed to couple a second storage node contact plug 190 to only one of the plurality of lower electrodes that are subsequently formed over a single storage node contact plug 190. For example, if the second storage node contact plug 190 is divided into five equal parts, the third storage node contact plug 200 may be located in one equal part.

Next, a lower electrode 210, a dielectric film 220, and an upper electrode 230 are sequentially formed over the third storage node contact plug 200. The lower electrode 210 may be formed as a bar type, and one lower electrode 210 may be coupled to one third storage node contact plug 200.

FIG. 3 and FIG. 4 show different portions of a single embodiment. As explained above, FIG. 3 is a cross-section of A-A' in FIG. 1I, and FIG. 4 is a cross-section of B-B' of FIG. 1I. Thus, the cross sections are taken through two neighboring second storage node contact plugs 190. Because each third storage node contact plug 200 couples a single contact plug 190 to a single lower electrode 210, the position of contact plugs 200 is different between FIG. 3 and FIG. 4.

Figure 5:
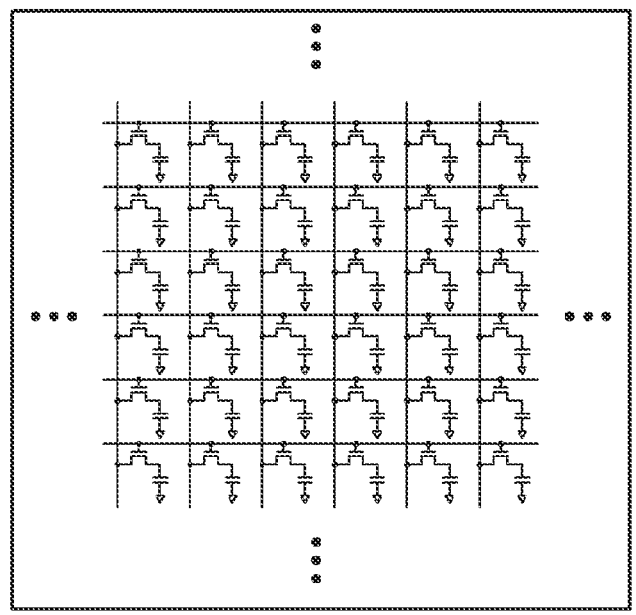
FIG. 5 is a block diagram illustrating a cell array according to embodiments of the present invention.

FIG. 5 is a block diagram illustrating an embodiment of a cell array.

Referring to FIG. 5, the cell array includes a plurality of memory cells, and each memory cell includes one transistor and one capacitor. Such memory cells are located at intersections of bit lines BL1~BLn and word lines WL1~WLm. The memory cells may store or output data in response to a voltage applied to any bit line (BL1, . . . , BLn) or any word line (WL1, . . . , WLm) selected by a column decoder and a row decoder.

With respect to FIG. 5, a first direction (i.e., a bit-line direction) of the bit lines (BL1, . . . , BLn) of the cell array may be the horizontal direction, and a second direction (i.e., a word-line direction) of the word lines (WL1, . . . , WLm) may be the vertical direction, such that the bit lines (BL1, . . . , BLn) cross the word lines (WL1, . . . , WLm). A first terminal (for example, a drain terminal) of a transistor is coupled to a bit line (BL1, . . . , BLn), a second terminal (for example, a source terminal) thereof is coupled to a capacitor and a third terminal thereof (for example, a gate terminal) is coupled to the a word line (WL1, . . . , WLm). A plurality of memory cells including the bit lines (BL1, . . . , BLn) and the word lines (WL1, . . . , WLm) may be located in a semiconductor cell array.

Figure 6:
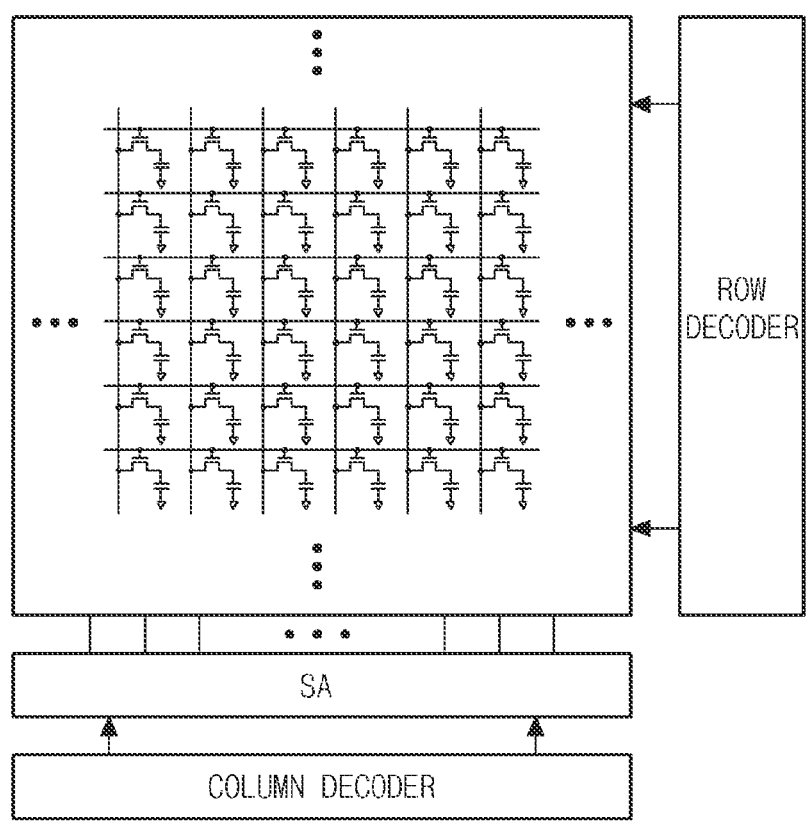
FIG. 6 is a block diagram illustrating a semiconductor device according to embodiments of the present invention.

FIG. 6 is a block diagram illustrating a semiconductor device according to the present invention.

Referring to FIG. 6, a semiconductor device may include a cell array, a row decoder, a column decoder, and a sense amplifier (SA). The row decoder selects a word line corresponding to a memory cell in which a read or write operation is to be performed from among a plurality of word lines of the semiconductor cell array, and outputs a word-line selection signal (RS) to the semiconductor cell array. In addition, the column decoder selects a bit line corresponding to a memory cell in which a read or write operation is to be performed from among a plurality of bit lines of the semiconductor cell array, and outputs a bit-line selection signal (CS) to the semiconductor cell array. The sense-amplifier (SA) may sense data (BDS) stored in a memory cell selected by the row decoder and column decoder.

The semiconductor device may be coupled to a microprocessor or a memory controller. The semiconductor device may receive control signals such as WE*, RAS* and CAS* from the microprocessor, receive data through an input/output (I/O) circuit, and store the received data. The semiconductor device may be applied to a Dynamic Random Access Memory (DRAM), a P-Random Access Memory (P-RAM), an M-Random Access Memory (M-RAM), a NAND flash memory, a CMOS Image Sensor (CIS), and the like. Specifically, the semiconductor device may be applied to computers including a desktop, a laptop, or a server, and may also be applicable to a graphics memory and a mobile memory. The NAND flash memory is applicable not only to a variety of portable storage media (for example, a memory stick, a multimedia card (MMC), a secure digital (SD) card a compact flash (CF) card, an eXtreme Digital (XD) card, a universal serial bus (USB) flash drive, etc.), but also to a variety of digital applications (for example, MP3 players, PMPs, digital cameras, camcorders, memory cards, USB, game machines, navigation devices, laptops, desktop computers, mobile phones, and the like). The CMOS Image Sensor (CIS) is a charge coupled device (CCD) serving as an electronic film in digital devices, and is applicable to camera phones, Web cameras, small-sized medical imaging devices, etc.

Figure 7:
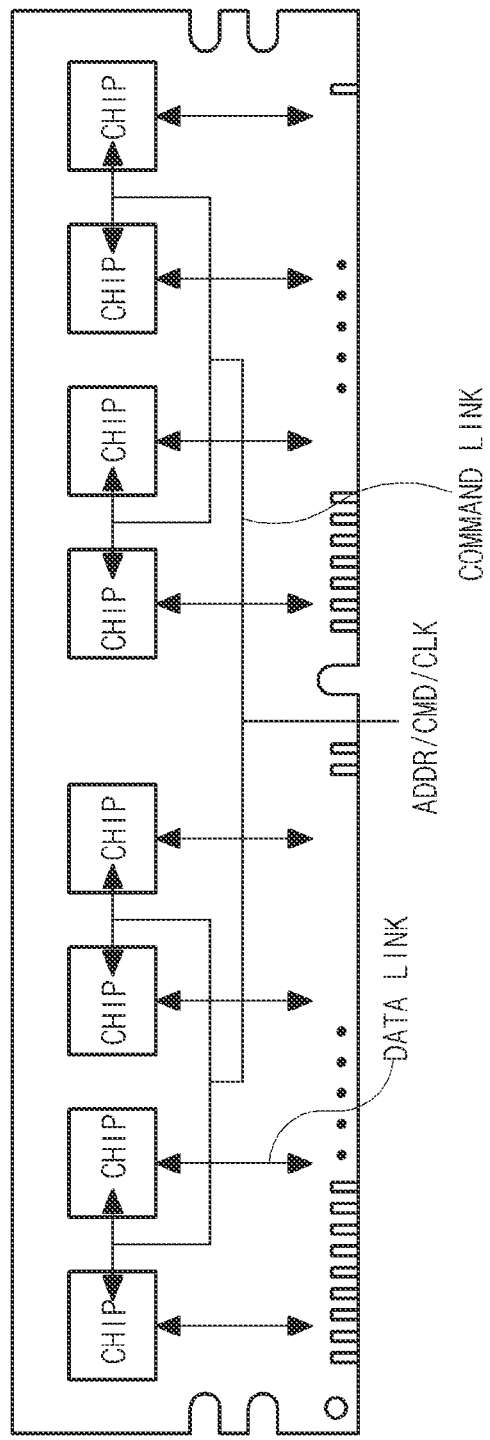
FIG. 7 is a block diagram illustrating a semiconductor module according to embodiments of the present invention.

FIG. 7 is a block diagram illustrating a semiconductor module according to an embodiment.

Referring to FIG. 7, a semiconductor module includes a plurality of semiconductor devices mounted to a module substrate, a command link for enabling each semiconductor device to receive a control signal (address signal (ADDR)), a command signal (CMD), a clock signal (CLK) from an external controller (not shown), and a data link coupled to a semiconductor device so as to transmit data. The command link and the data link may be formed to be identical or similar to those of general semiconductor modules.

Although eight semiconductor chips are mounted to the front surface of the module substrate shown in FIG. 7, The semiconductor chips can also be mounted to the back surface of the module substrate. That is, the semiconductor chips can be mounted to one side or both sides of the module substrate, and the number of mounted semiconductor chips is not limited to the example of FIG. 7. In addition, a material or structure of the module substrate is not limited to those of FIG. 7, and the module substrate may also be formed of other materials or structures.

Figure 8:
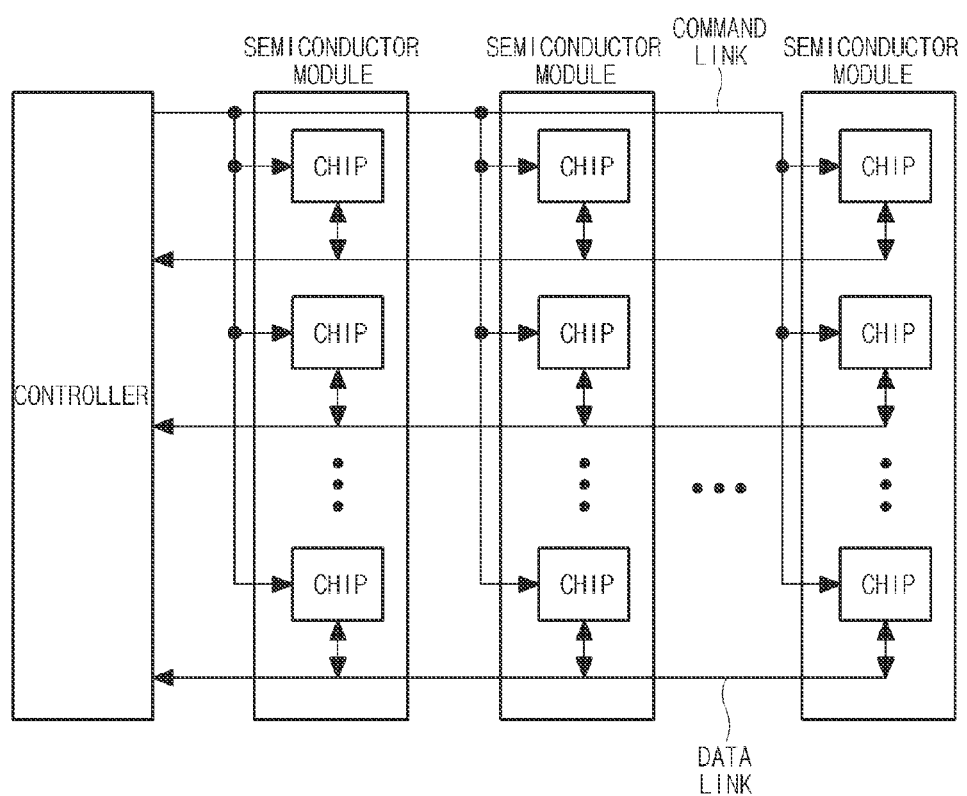
FIG. 8 is a block diagram illustrating a semiconductor system according to embodiments of the present invention.

FIG. 8 is a block diagram illustrating a semiconductor system according to the present invention.

Referring to FIG. 8, a semiconductor system includes at least one semiconductor module including a plurality of semiconductor chips, and a controller for providing a bidirectional interface between each semiconductor module and an external system (not shown) so as to control the operations of the semiconductor module. The controller may be identical or similar in function to a controller for controlling a plurality of semiconductor modules for use in a general data processing system, and as such a detailed description thereof will be omitted herein. In an embodiment, the semiconductor module may be, for example, a semiconductor module shown in FIG. 7.

Figure 9:
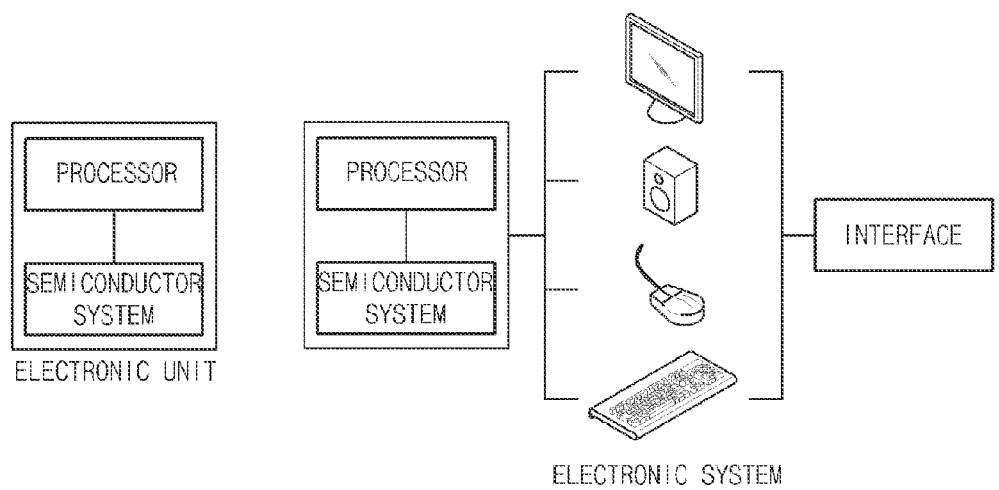
FIG. 9 is a block diagram illustrating an electronic unit and an electronic system according to embodiments of the present invention.

FIG. 9 is a block diagram illustrating an electronic unit and an electronic system according to an embodiment of the present invention. Referring to the left drawing of FIG. 9, the electronic unit includes an electronic unit and a processor electrically coupled to the electronic unit. The semiconductor system of FIG. 9 may be the dams as that of FIG. 8. In this case, the processor may include a Central Processing Unit (CPU), a Micro Processor Unit (MPU), a Micro Controller Unit (MCU), a Graphics Processing Unit (GPU), and a Digital Signal Processor (DSP).

In this case, the CPU or MPU is configured in the form of a combination of an Arithmetic Logic Unit (ALU) serving as an arithmetic and logical operation unit and a Control Unit (CU) for controlling each unit by reading and interpreting a command. If the processor is a CPU or MPU, the electronic unit may include a computer or a mobile device. In addition, the GPU is used to calculate numbers having decimal points, and corresponds to a process for generating graphical data in real-time. If the processor is a GPU, the electronic unit may include a graphic device. In addition, DSP involves converting an analog signal (e.g., voice signal) into a digital signal at high speed, using the calculated result, re-converting the digital signal into an analog signal, and using the re-converted result. The DSP mainly calculates a digital value. If the processor is a DSP, the electronic unit may include a sound and imaging device.

The processor includes an Accelerate Calculation Unit (ACU), and is configured in the form of a CPU integrated into the GPU, such that it serves as a graphics card.

Referring to FIG. 9, the electronic system may include one or more interfaces electrically coupled to the electronic unit The interface may include a monitor, a keyboard, a printer, a pointing device (mouse), a USB, a switch, a card reader, a keypad, a dispenser, a phone, a display or a speaker. However, the scope of the interface is not limited thereto and is also applicable to other examples.

As is apparent from the above description, an embodiment of an apparatus and method for forming a semiconductor device may have one or more of the following advantages. The height of the capacitor may be reduced to prevent defects including a leaning capacitor or a poor bridge from being generated, such that the fabrication process of semiconductor devices is simplified and therefore the semiconductor devices can be more stably manufactured.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
    a first storage node contact plug disposed in a contact hole over a semiconductor substrate;
    a second pad type storage node contact plug formed over the first storage node contact plug;
    a third bar type storage node contact plug formed over the second storage node contact plug; and
    a bar type lower electrode formed over the third storage node contact plug,
    wherein a group of from three to seven second storage node contact plugs are disposed under the lower electrode.

2. The semiconductor device according to claim 1, wherein the third storage node contact plug occupies a smaller area in a horizontal plane than the second storage node contact plug.

3. The semiconductor device according to claim 1, wherein:
    each of a plurality of neighboring third storage node contact plugs arranged in a direction parallel to a bit line is disposed directly over a first portion of the underlying second storage node contact plugs.

4. The semiconductor device according to claim 1, wherein each of a plurality of neighboring third storage node contact plugs arranged in a direction parallel to a bit line is disposed directly over a different portion of the underlying second storage node contact plugs.

5. The semiconductor device according to claim 1, wherein the length of the lower electrode in a long-axis direction is longer than the length of the third storage node contact plug in a long-axis direction.

6. The semiconductor device according to claim 1, wherein a width of the second storage node contact plug is greater than a width of the first storage node contact plug.

7. A semiconductor device comprising:
    a semiconductor substrate;
    a bit line disposed in a first direction;
    a contact hole disposed over the semiconductor substrate;
    a first level storage node contact plug disposed in the contact hole;
    a second level storage node contact plug disposed over the first level storage node contact plug and coupled to the first level storage node contact plug;
    a third level storage node contact plug disposed over the second level storage node contact plug and coupled to the second level storage node contact plug; and
    a lower electrode disposed over a group of second level storage node contact plugs and coupled to the third level storage node contact plug.

8. The semiconductor device of claim 7, wherein the second level storage node contact plugs in the group are arranged the first direction.

9. The semiconductor device of claim 7, wherein the second level storage node contact plugs in the group are arranged in a second direction perpendicular to the first direction.

10. The semiconductor device of claim 7, wherein the group consists of five second level storage node contact plugs.

11. The semiconductor device of claim 7, wherein each of the second level storage node contact plugs in the group is coupled to a single lower electrode through a single third level storage node contact plug.

12. The semiconductor device of claim 11, wherein each of the second level storage node contact plugs is divided into a number of zones corresponding to the number of second level storage node contact plugs in the group, and one third level storage node contact plug is disposed over a different zone for each of the second level storage node contact plugs in the group.

13. The semiconductor device of claim 7, wherein a number of second level storage node contact plugs in the group is disposed under an equal number lower electrodes.

14. The semiconductor device of claim 7, wherein opposing sides of each of the second level storage node contact plugs in the group are disposed along parallel lines.

15. The semiconductor device of claim 14, wherein the group of second level storage node contact plugs includes from three to seven second level storage node contact plugs.

* * * * *